(12) United States Patent
Apalkov et al.

(10) Patent No.: US 8,786,039 B2
(45) Date of Patent: Jul. 22, 2014

(54) METHOD AND SYSTEM FOR PROVIDING MAGNETIC JUNCTIONS HAVING ENGINEERED PERPENDICULAR MAGNETIC ANISOTROPY

(71) Applicants: Dmytro Apalkov, San Jose, CA (US); Chang-Man Park, Los Altos, CA (US); Roman Chepulskyy, Milpitas, CA (US); Alexey Vasilyevitch Khvalkovskiy, Milpitas, CA (US); Xueti Tang, San Jose, CA (US)

(72) Inventors: Dmytro Apalkov, San Jose, CA (US); Chang-Man Park, Los Altos, CA (US); Roman Chepulskyy, Milpitas, CA (US); Alexey Vasilyevitch Khvalkovskiy, Milpitas, CA (US); Xueti Tang, San Jose, CA (US)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/723,172

(22) Filed: Dec. 20, 2012

(65) Prior Publication Data
US 2014/0175582 A1    Jun. 26, 2014

(51) Int. Cl.
*H01L 29/82*    (2006.01)

(52) U.S. Cl.
USPC .............. 257/421; 257/425; 257/E27.006; 438/48; 365/158

(58) Field of Classification Search
USPC .............. 257/421, 425, E27.006; 438/48; 365/158
See application file for complete search history.

(56) References Cited

U.S. PATENT DOCUMENTS

| | | | |
|---|---|---|---|
| 2011/0031569 A1* | 2/2011 | Watts et al. | 257/421 |
| 2012/0155156 A1* | 6/2012 | Watts et al. | 365/158 |
| 2012/0175717 A1* | 7/2012 | Bessho et al. | 257/421 |

* cited by examiner

*Primary Examiner* — Tu-Tu Ho
(74) *Attorney, Agent, or Firm* — Convergent Law Group LLP (57) ABSTRACT

A method and system provide a magnetic junction usable in a magnetic device. The magnetic junction includes a reference layer, a nonmagnetic spacer layer, and a free layer. The nonmagnetic spacer layer is between the reference layer and the free layer. The free layer has an engineered perpendicular magnetic anisotropy. The engineered PMA includes at least one of an insulating insertion layer induced PMA, a stress induced PMA, PMA due to interface symmetry breaking, and a lattice mismatch induced PMA. The magnetic junction is configured such that the free layer is switchable between a plurality of stable magnetic states when a write current is passed through the magnetic junction.

40 Claims, 6 Drawing Sheets

METHOD AND SYSTEM FOR PROVIDING MAGNETIC JUNCTIONS HAVING ENGINEERED PERPENDICULAR MAGNETIC ANISOTROPY

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

Figure 1:
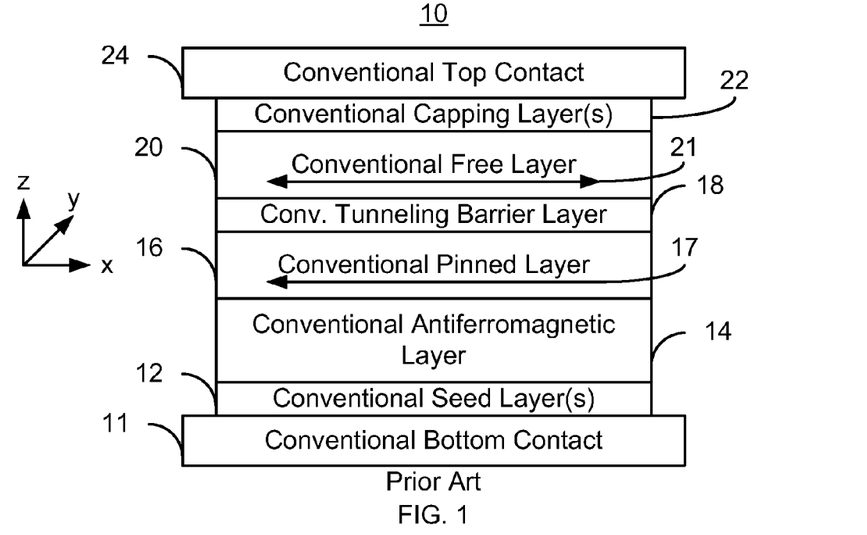
FIG. 1 depicts a conventional magnetic junction.

For example, FIG. 1 depicts a conventional magnetic tunneling junction (MTJ) 10 as it may be used in a conventional STT-MRAM. The conventional MTJ 10 typically resides on a bottom contact 11, uses conventional seed layer(s) 12 and includes a conventional antiferromagnetic (AFM) layer 14, a conventional pinned layer 16, a conventional tunneling barrier layer 18, a conventional free layer 20, and a conventional capping layer 22. Also shown is top contact 24.

Conventional contacts 11 and 24 are used in driving the current in a current-perpendicular-to-plane (CPP) direction, or along the z-axis as shown in FIG. 1. The conventional seed layer(s) 12 are typically utilized to aid in the growth of subsequent layers, such as the AFM layer 14, having a desired crystal structure. The conventional tunneling barrier layer 18 is nonmagnetic and is, for example, a thin insulator such as MgO.

The conventional pinned layer 16 and the conventional free layer 20 are magnetic. The magnetization 17 of the conventional pinned layer 16 is fixed, or pinned, in a particular direction, typically by an exchange-bias interaction with the magnetization of AFM layer 14. Although depicted as a simple (single) layer, the conventional pinned layer 16 may include multiple layers. For example, the conventional pinned layer 16 may be a synthetic antiferromagnetic (SAF) layer including magnetic layers antiferromagnetically coupled through thin conductive layers, such as Ru. In such a SAF, multiple magnetic layers interleaved with a thin layer of Ru may be used. In another embodiment, the coupling across the Ru layers can be ferromagnetic. Multilayers may also be used separately or as the magnetic layers in the SAF. Further, other versions of the conventional MTJ 10 might include an additional pinned layer (not shown) separated from the free layer 20 by an additional nonmagnetic barrier or conductive layer (not shown).

The conventional free layer 20 has a changeable magnetization 21. Although depicted as a simple layer, the conventional free layer 20 may also include multiple layers. For example, the conventional free layer 20 may be a synthetic layer including magnetic layers antiferromagnetically or ferromagnetically coupled through thin conductive layers, such as Ru. Although shown as in-plane, the magnetization 21 of the conventional free layer 20 may have a perpendicular anisotropy. Thus, the pinned layer 16 and free layer 20 may have their magnetizations 17 and 21, respectively oriented perpendicular to the plane of the layers.

To switch the magnetization 21 of the conventional free layer 20, a current is driven perpendicular to plane (in the z-direction). When a sufficient current is driven from the top contact 24 to the bottom contact 11, the magnetization 21 of the conventional free layer 20 may switch to be parallel to the magnetization 17 of the conventional pinned layer 16. When a sufficient current is driven from the bottom contact 11 to the top contact 24, the magnetization 21 of the free layer may switch to be antiparallel to that of the pinned layer 16. The differences in magnetic configurations correspond to different magnetoresistances and thus different logical states (e.g. a logical "0" and a logical "1") of the conventional MTJ 10. Thus, by reading the tunneling magnetoresistance (TMR) of the conventional MTJ 10 the state of the conventional MTJ can be determined.

Although the conventional MTJ 10 may be written using spin transfer, read by sensing the TMR of the junction, and used in an STT-MRAM, there are drawbacks. For example, the magnetic moments of the conventional free layer 20 and conventional pinned layer 16 may be desired to be perpendicular to plane, providing a high perpendicular magnetic anisotropy (PMA). A high PMA occurs when the perpendicular anisotropy energy exceeds the out-of-plane demagnetization energy. This results in a magnetic moment that has a component perpendicular to plane and may be fully perpendicular to plane. Although such conventional high PMA junctions do exist, the PMA may be reduced by various factors. For example, PMA may be reduced by Co inclusions into Fe in a CoFe free layer 20, by the presence of boron in the conventional free layer 20, as well as other factors. Further, the thermal stability of the conventional free layer 20 may be difficult to maintain using conventional high PMA materials. As a result, performance of the conventional MTJ may suffer. Consequently, mechanisms for tailoring the PMA may be desired.

Accordingly, what is needed is a method and system that may improve the performance of the spin transfer torque based memories. The method and system described herein address such a need.

BRIEF SUMMARY OF THE INVENTION

A method and system provide a magnetic junction usable in a magnetic device. The magnetic junction includes a reference layer, a nonmagnetic spacer layer, and a free layer. The nonmagnetic spacer layer is between the reference layer and the free layer. The free layer has an engineered perpendicular magnetic anisotropy. The engineered PMA includes at least one of an insulating insertion layer induced PMAa stress induced PMA, PMA due to interface symmetry breaking, and a lattice mismatch induced PMA. The magnetic junction is configured such that the free layer is switchable between a plurality of stable magnetic states when a write current is passed through the magnetic junction.

DETAILED DESCRIPTION OF THE INVENTION

The exemplary embodiments relate to magnetic junctions usable in magnetic devices, such as magnetic memories, and the devices using such magnetic junctions. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

Methods and systems provide a magnetic junction as well as a magnetic memory utilizing the magnetic junction. The magnetic junction includes a reference layer, a nonmagnetic spacer layer, and a free layer. The nonmagnetic spacer layer is between the reference layer and the free layer. The free layer has an engineered perpendicular magnetic anisotropy. The engineered PMA includes at least one of an insulating insertion layer induced PMA, a stress induced PMA, PMA due to interface symmetry breaking, and a lattice mismatch induced PMA. The mechanism for insulating insertion layer induced PMA can be related to electron hybridization between the free layer material and insulating layer material, however other mechanisms in addition to electron hybridization can be present. The magnetic junction is configured such that the free layer is switchable between a plurality of stable magnetic states when a write current is passed through the magnetic junction.

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy (particularly perpendicular magnetic anisotropy), and other physical phenomena. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or free layers having particular layers, materials and characteristics. However, one of ordinary skill in the art will readily recognize that magnetic junctions and/or free layers having additional and/or different layers, materials and/or characteristics not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions and free layers. However, one of ordinary skill in the art will readily recognize that the method and system are consistent with the use of magnetic memories having multiple magnetic junctions and using multiple free layers. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Figure 2:
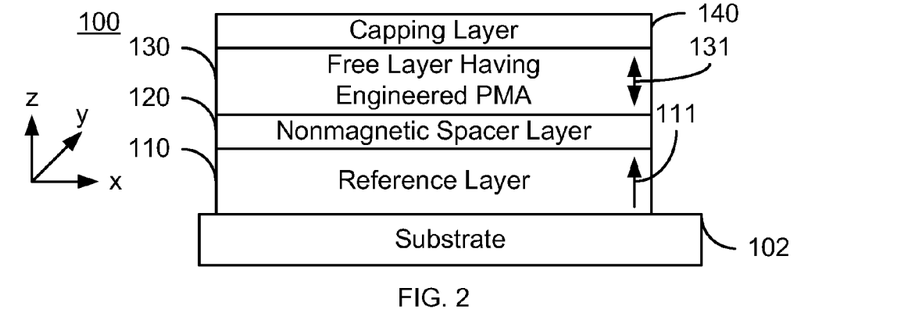
FIG. 2 depicts an exemplary embodiment of a magnetic junction including a free layer having an engineered perpendicular magnetic anisotropy and switchable using spin transfer.

FIG. 2 depicts an exemplary embodiment of a magnetic junction 100 including a free layer having an engineered perpendicular magnetic anisotropy and that is switchable using spin transfer. The magnetic junction may be, for example a magnetic tunneling junction (MTJ), spin valve, or ballistic magnetoresistance structure, or some combination thereof. The magnetic junction 100 may be used in a variety of applications. For example, the magnetic junction may be used in a magnetic memory such as an STT-MRAM. For clarity, FIG. 2 is not to scale.

The magnetic junction includes a reference layer 110, a nonmagnetic spacer layer 120, a free layer 130 and a capping layer 140. The magnetic junction 100 is shown as residing on a substrate 102. In some embodiments, the magnetic junction 100 may include seed layer(s) and/or additional capping layer(s) (not shown). Although layers 110, 120, 130 and 140 are shown with a particular orientation, this orientation may vary in other embodiments. For example, the free layer 130 may be closer to the bottom (closest to the substrate 102) of the magnetic junction 100. A pinning layer (not shown) may also be used. In general, the pinning layer would be used if the magnetic moment of the reference layer 110 (also known as a pinned layer) is in plane but would not be used if the magnetic moment of the reference layer 110 is perpendicular to plane, as is shown and generally desired. Such a pinning layer may be used to fix the magnetization 111 of the reference layer 110. In some embodiments, the pinning layer may be an AFM layer or multilayer that pins the magnetization (not shown) of the reference layer 110 by an exchange-bias interaction. The magnetic junction 100 is also configured to allow the free layer 130 to be switched between stable magnetic states when a write current is passed through the magnetic junction 100. In some embodiments, the write current alone may be used to switch the magnetic junction while in others the write current may be in addition to other switching mechanisms. Thus, the magnetic moment 131 of the free layer 130 is switchable utilizing spin transfer torque. Because the magnetic moment 131 is switchable, the magnetic moment 131 is indicated by a dual headed arrow.

The nonmagnetic spacer layer 120 may be a tunneling barrier layer, conductor, or other structure for which magnetoresistance is exhibited between the reference layer 110 and the free layer 130. In some embodiments, the nonmagnetic spacer layer 120 is a crystalline MgO tunneling barrier layer. Such a nonmagnetic spacer layer may have a preferred crystallographic orientation, such as a (100) orientation.

Although depicted as simple layers, the reference layer 110 and/or the free layer 130 may include multiple layers. For example, the reference layer 110 and/or the free layer 130 may be a SAF including magnetic layers antiferromagnetically or ferromagnetically coupled through thin layers, such as Ru. In such a SAF, multiple magnetic layers interleaved with thin layer(s) of Ru or other material may be used. The reference layer 110 and/or the free layer 130 may also be another multilayer.

The reference layer 110 and/or the free layer 130 may each have a perpendicular anisotropy energy that exceeds the out-of-plane demagnetization energy. As such, the reference layer 110 and/or the free layer 130 may have a high perpendicular magnetic anisotropy (PMA). In the embodiment shown, both the reference layer 110 and the free layer 130 have a high PMA. Thus, the reference layer 110 and the free layer 130 each has its magnetic moment 111 and 131, respectively, oriented perpendicular to plane at equilibrium as is shown in FIG. 2. Stated differently, the easy axes of the layer 110 and 130 are perpendicular to plane. However, in other embodiments, one or both of the reference layer 110 and the free layer 130 may have an in-plane magnetic moment. The magnetic moment 111 of the reference layer 110 may be fixed in a particular direction. In the embodiment shown, the magnetic moment 111 of the reference layer 110 is in the positive z-direction. In another embodiment, the magnetic moment 111 may be in the negative z direction. In other embodiments, the magnetic moment of the reference layer 110 may be stable in another direction including but not limited to in-plane. Other orientations of the magnetic moments of the reference layer 110 and/or the free layer 130 are possible.

The free layer 130 has an engineered PMA. Stated differently, the magnetic junction 100 has been configured such that the PMA of the free layer 130 is in a desired range. In some embodiments, the free layer 130 itself is configured to provide the desired PMA. In other embodiments, other portions of the magnetic junction 100, some of which may not be shown in FIG. 2, may be configured to induce the desired PMA in the free layer 130. For example, the engineered PMA may include one or more of an insulating insertion layer induced PMA, a stress induced PMA, PMA due to interface symmetry breaking, and a lattice mismatch induced PMA. An insulating insertion layer induced PMA occurs for particular magnetic insulating layer(s) inserted into the free layer. A stress induced PMA may occur when a stress induced in the free layer results in changes to the PMA. For example, the free layer may be fabricated such that the free layer is under a strain. In other embodiments, other layers may be provided in the magnetic element 100 to exert a stress on the free layer. The lattice mismatch induced PMA results from a mismatch between a portion of the free layer 130 and another layer in the magnetic junction 100. In some embodiments, this may be considered a special case of the stress induced PMA. The engineered PMA of the free layer 130 is configured to be in the range desired. In some embodiments, the engineered PMA is such that the free layer 130 has a high PMA. Thus, the magnetic moment 131 is perpendicular-to-plane, as shown in FIG. 2. However, in other embodiments, the engineered PMA may configured to be less than the out-of-plane demagnetization energy.

Using the engineered PMA, the PMA of the free layer 130 may be configured as desired. The engineered PMA may allow the free layer 130 to have a high PMA at equilibrium. Stated differently, the magnetic moment 131 of the free layer 130 may be perpendicular to plane and thermally stable at equilibrium, as shown in FIG. 2. During switching the engineered PMA may be configured to be reduced or remain the same. Thus, the PMA of the free layer 130 may be tailored as desired, particularly for a high PMA. As a result, the switching characteristics of the free layer 130 may be enhanced.

Figure 3:
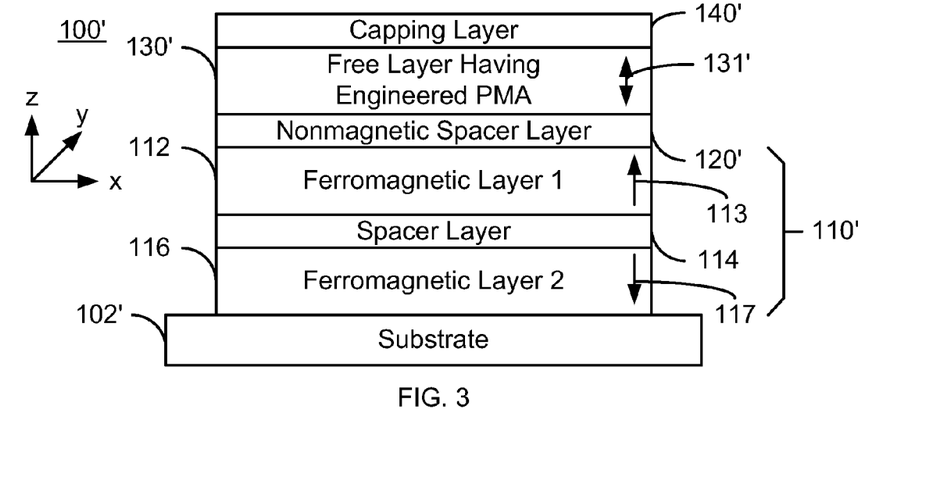
FIG. 3 depicts another exemplary embodiment of a magnetic junction including a free layer having an engineered perpendicular magnetic anisotropy and switchable using spin transfer.

FIG. 3 depicts another exemplary embodiment of a magnetic junction 100' including a free layer 130' having an engineered PMA and that is switchable using spin transfer. For clarity, FIG. 3 is not to scale. The magnetic junction 100' is analogous to the magnetic junction 100. Thus, analogous layers are labeled similarly. The magnetic junction 100' includes a reference layer 110', a nonmagnetic spacer layer 120', a free layer 130' and a capping layer 140' analogous to the layers 110, 120, 130, and 140, respectively. Although layers 110', 120', 130' and 140' are shown with a particular orientation, this orientation may vary in other embodiments. In some embodiments, an optional seed layer (not shown), an optional pinning layer (not shown) and/or optional capping layer (not shown) may be included. The magnetic junction 100' is also configured to allow the magnetization of the free layer 130' to be switched between stable magnetic states when a write current is passed through the magnetic junction 100'. Thus, the magnetization of the free layer 130' is switchable utilizing spin transfer torque. In addition, the free layer 130' has an engineered PMA analogous to that described above.

In the magnetic junction 100', the reference layer 110' is a synthetic layer, including two ferromagnetic layers 112 and 116 separated by a nonmagnetic spacer layer 114. The magnetic moments 113 and 117 of the ferromagnetic layers 112 and 116 are antiferromagnetically coupled, for example via an RKKY coupling. However, in other embodiments, other coupling mechanisms may be possible. In addition, the ferromagnetic layers 112 and 116 are both depicted as having a high PMA (PMA energy being greater than out of plane demagnetization energy). As such, the magnetic moments 113 and 117 are shown as perpendicular to plane. However, in other embodiments, other orientations may be used.

The magnetic junction 100' may share the benefits of the magnetic junction 100. Because of the engineered PMA of the free layer 130', the magnetic moment 131' of the free layer 130' may be perpendicular to plane and have the desired PMA. Further, because the ferromagnetic layers 112 and 116 of the reference layer 110' are antiferromagnetically coupled, the free layer 130' may be subject to a smaller external field due to the reference layer 110'. The performance of the magnetic junction 100' may thus be improved.

Figure 4:
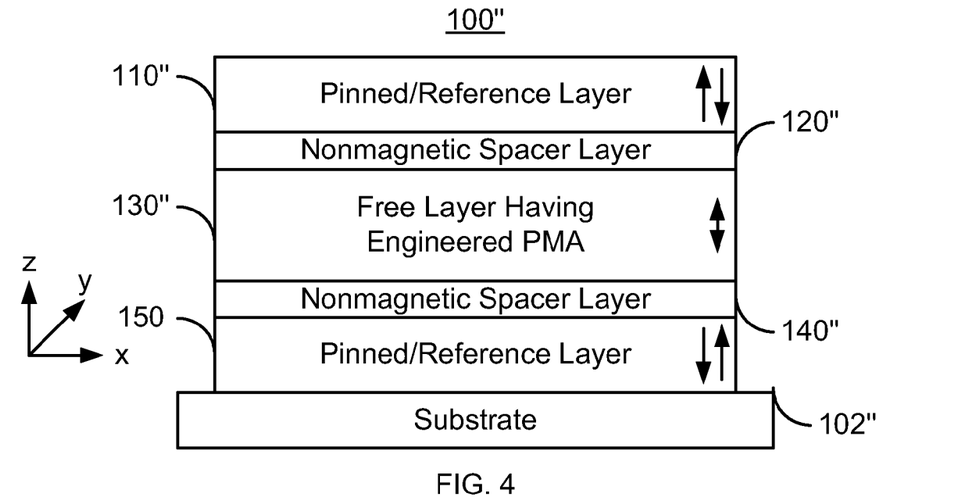
FIG. 4 depicts another exemplary embodiment of a magnetic junction including a free layer having an engineered perpendicular magnetic anisotropy and switchable using spin transfer.

FIG. 4 depicts another exemplary embodiment of a magnetic junction 100" including a free layer 130" having an engineered PMA and that is switchable using spin transfer. For clarity, FIG. 4 is not to scale. The magnetic junction 100" is analogous to the magnetic junction 100 and/or 100'. Thus, analogous layers are labeled similarly. The magnetic junction 100" includes a reference layer 110", a nonmagnetic spacer layer 120", and a free layer 130" analogous to the layers 110/110', 120/120', and 130/130', respectively. The magnetic junction 100" also includes an additional spacer layer 140" in lieu of capping layer 140/140' and additional reference layer 150. Although layers 110", 120", 130", and 140" are shown with a particular orientation, this orientation may vary in other embodiments. In some embodiments, an optional seed layer (not shown), an optional pinning layer (not shown) and/or optional capping layer (not shown) may be included.

The magnetic junction 100" is also configured to allow the magnetization of the free layer 130" to be switched between stable magnetic states when a write current is passed through the magnetic junction 100". Thus, the magnetization of the free layer 130" is switchable utilizing spin transfer torque. In addition, the free layer 130" has an engineered PMA analogous to that described above.

The magnetic junction 100" is a dual magnetic junction including two reference layers 110" and 150. Although shown as simple layers, the reference layer 130" and/or 150 may be synthetic. The reference layers 110" and 150 are both depicted as having a high PMA (PMA energy greater than out of plane demagnetization energy). As such, the magnetic moments are shown as perpendicular to plane. However, in other embodiments, other orientations may be used. The magnetic moments of the reference layers 110" and 150 may also be desired to be antiparallel. Thus, as is shown in FIG. 4, if the magnetic moment of the reference layer 110" is in the positive z-direction, then the magnetic moment of the reference layer 150 is in the negative z-direction and vice versa.

The magnetic junction 100" may share the benefits of the magnetic junctions 100 and/or 100'. Because of the engineered PMA of the free layer 130", the magnetic moment 131" of the free layer 130" may be perpendicular to plane and have the desired PMA. The external field at the free layer 130" may be further reduced if the reference layers 110" and/or 150 are synthetic. Further, two reference layers 110" and 150 are used. If the moments closest to the free layer 130" for these reference layers 110" and 150 are antiparallel, the spin transfer torque on the free layer 130" during switching may be enhanced. More specifically, spin polarized electrons from the reference layers 110" and 150 should have an additive effect on spin transfer switching for current driven in the perpendicular-to-plane direction. The magnetic junction 100" may have a lower switching current. The performance of the magnetic junction 100' may thus be improved.

The magnetic junctions 100, 100' and/or 100" thus enjoy benefits at least in part due to the engineered PMA of the free layer 130/130'/130". FIGS. 5-11 indicate various mechanisms by which the engineered PMA may be achieved. The mechanisms depicted in FIGS. 5-11 may be used separately. In other embodiments, some or all of the mechanisms used in engineering PMA of the free layer in FIGS. 5-11 may be combined in a single magnetic junction/free layer. However, nothing prevents the PMA of the free layer 130, 130', and/or 130" from being engineered in another manner.

Figure 5:
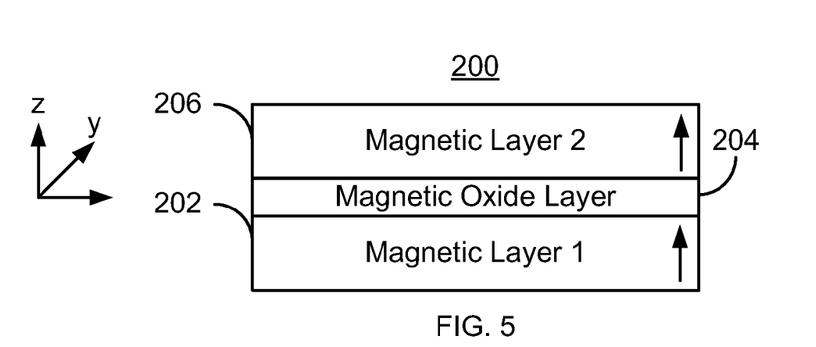
FIG. 5 depicts an exemplary embodiment of a free layer having an insertion layer induced perpendicular magnetic anisotropy and switchable using spin transfer.

FIG. 5 depicts an exemplary embodiment of a free layer 200 that has an engineered PMA, is switchable using spin transfer, and that may be used in a magnetic junction such as the magnetic junction 100, 100', and/or 100'. For clarity, FIG. 5 is not to scale. The free layer 200 is shown as including two magnetic layers 202 and 206 separated by an insulating insertion layer 204 that may be used in engineering the PMA of the free layer 200. The insulating insertion layer 204 may be a magnetic oxide layer. In some embodiments, the free layer 200 consists of layers 202, 204 and 206. In other embodiments, the free layer 200 may be a multilayer including but not limited to a SAF. In such embodiments, the layers 202, 204 and/or 206 may be included in one or more of the ferromagnetic layers of the SAF.

The magnetic layers 202 and 206 may include materials such as CoFeB (with up to twenty percent B). The magnetic layers 202 and 206 may also be not more than twenty Angstroms thick. However, in other embodiments, other materials and/or other thicknesses may be used. The magnetic layers 202 and/or 206 may be conductive. The magnetic layers 202 and/or 206 may also be alloys. In other embodiments, the magnetic layers 202 and/or 206 may have a lower conductivity, but would still be desired to have a conductivity high enough to carry a sufficient current for operation in the CPP direction. Other magnetic materials may be used to provide the desired characteristics of the free layer 200. In some embodiments, the magnetic layers 202 and 206 are CoFeB layers each of which is not more than twenty Angstroms thick. However the thicknesses of the layers 202 and 206 are such that the free layer 200 is thermally stable. Thus, the Δ (magnetic anisotropy energy divided by $k_bT$, where T is room temperature) of the free layer 200 is desired to be above sixty.

The oxide layer 204 may enhance the PMA of the adjoining magnetic layers 202 and 206. The oxide layer 204 is also magnetic. This is in contrast to a magnetic tunneling junction that may have a nonmagnetic oxide layer, such as MgO, VO and TiO, between ferromagnetic layers. Although nonmagnetic MgO may be used in enhancing the PMA of the magnetic layers 202 and 204, the coupling between the layers 202 and 206 through the nonmagnetic MgO would be small. As a result, the thermal stability of a free layer formed using MgO in lieu of the oxide layer 204 may be adversely affected for small sizes. In contrast, the magnetic insertion layer 204 is a ferromagnetic oxide layer 204. As a result, the magnetic layers 202 and 206 are ferromagnetically coupled. The ferromagnetic oxide layer 204 may also be selected to enhance the PMA of the ferromagnetic layers 202 and 206. Thus, the free layer 200 may have enhanced/engineered PMA as well as thermal stability due to the ferromagnetic coupling through the magnetic oxide layer 204.

In some embodiments, the magnetic oxide layer 204 includes at least one of NiO and NiOx. NiO and NiOx increase the PMA of to an extent similar to MgO the free layer 200. NiO is nickel oxide that may be provided using an alloy target. NiOx may be formed by depositing a Ni layer and oxidizing the layer. NiO is antiferromagnetic at thicknesses of 3-4 monolayers or more. Thus, the magnetic oxide layer 204 may be less than three monolayers thick for NiO/NiOx. In other embodiments, other magnetic oxides that may enhance the PMA of the magnetic layers 202 and 206 may be used.

The free layer 200 and, therefore, magnetic junctions such as 100, 100' and/or 100" may have improved performance. Use of materials such as NiO and/or NiOx allows the free layer 200 to have increased PMA. As a result, the free layer 200 may be more likely to be stable with the magnetic moments perpendicular to plane, as shown in FIG. 5. In addition, the magnetic layers 202 and 206 are ferromagnetically coupled through the magnetic oxide layer 204. As a result, the free layer 200 may be more thermally stable even at smaller sizes of the free layer 200 and smaller thicknesses of the magnetic layers 202 and 206. Consequently, the free layer 200 may be thermally stable and suitable for use at higher memory densities.

Figure 6:
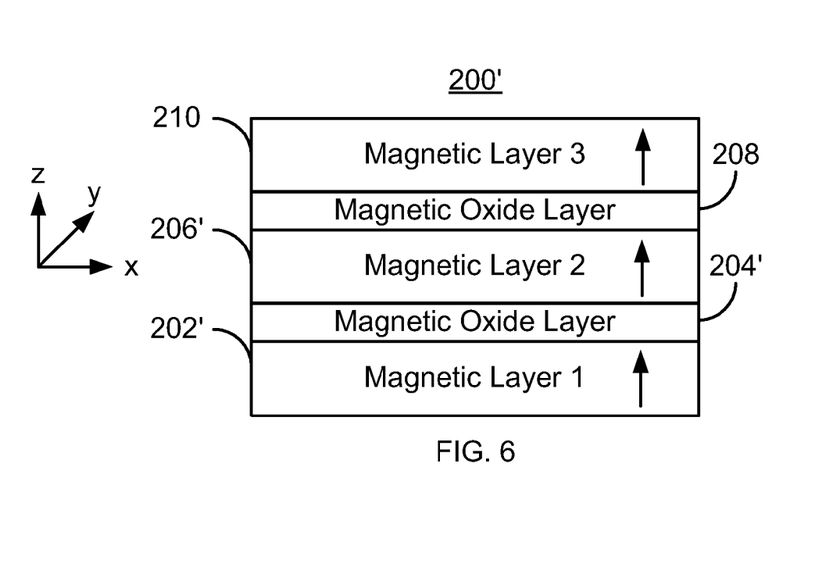
FIG. 6 depicts another exemplary embodiment of a free layer having an insertion layer induced perpendicular magnetic anisotropy and switchable using spin transfer.

FIG. 6 depicts an exemplary embodiment of a free layer 200' that has an engineered PMA, is switchable using spin transfer, and that may be used in a magnetic junction such as the magnetic junction 100, 100', and/or 100'. For clarity, FIG. 6 is not to scale. The free layer 200' is analogous to the free layer 200. Thus, analogous layers are labeled similarly. The free layer 200' includes magnetic layers 202', 206' and 210 interleaved with magnetic oxide layer 204' and 208. The two magnetic layers 202' and 206' separated by a magnetic oxide layer 204' are analogous to the magnetic layers 202 and 206 and the magnetic oxide layer 204, respectively. Although a particular number of magnetic layers 202', 206' and 210 and a particular number of magnetic oxide/insertion layers 204' and 208 are shown, another number of magnetic layers and magnetic oxide/insertion layers might be used. Thus, the free layer 200' is shown as consisting of layers 202', 204', 206', 208 and 210. In other embodiments, the free layer 200' may include other ferromagnetic oxide layers (not shown) interleaved with magnetic layers (not shown).

The free layer 200' includes an additional magnetic oxide layer 208 and a magnetic layer 210. The magnetic oxide layer 208 is analogous to the magnetic oxide layer 204'. The magnetic layer 210 is analogous to the layers 202' and 206'. For example, the magnetic layer 210 may include materials such as CoFeB (with up to twenty percent B). In some embodiments, the magnetic layer 210 is a CoFeB layer that is not more than twenty Angstroms thick. However, in other embodiments, other materials and/or other thicknesses may be used. The thicknesses of the layers 202', 206' and 210 are such that the free layer 200' is thermally stable. The magnetic oxide layer 208 may enhance the PMA of the adjoining magnetic layers 210 and 206'. The magnetic oxide layer 210 also allows the magnetic layers 206' and 210 to be ferromagnetically coupled. In some embodiments, the magnetic oxide layer 208 includes at least one of NiO and NiOx. In such embodiments, the magnetic oxide layer 208 may be less than three monolayers thick to ensure that the layer 208 is ferromagnetic. Thus, the free layer 200' may have enhanced/engineered PMA as well as thermal stability due to the ferromagnetic coupling through the magnetic oxide layers 204' and 208.

The free layer 200' shares the benefits of the free layer 200. In particular, the free layer 200' has an engineered PMA. In some embodiments, the free layer 200' has an increased PMA. Further, because the magnetic layers 202 and 206 and the magnetic layers 202', 206' and 210 are ferromagnetically coupled, the free layers 200 and/or 200' are more thermally stable even at smaller sizes. As a result, performance of the free layer 200/200' and the performance of magnetic elements incorporating the free layer 200/200' may be improved.

Figure 7:
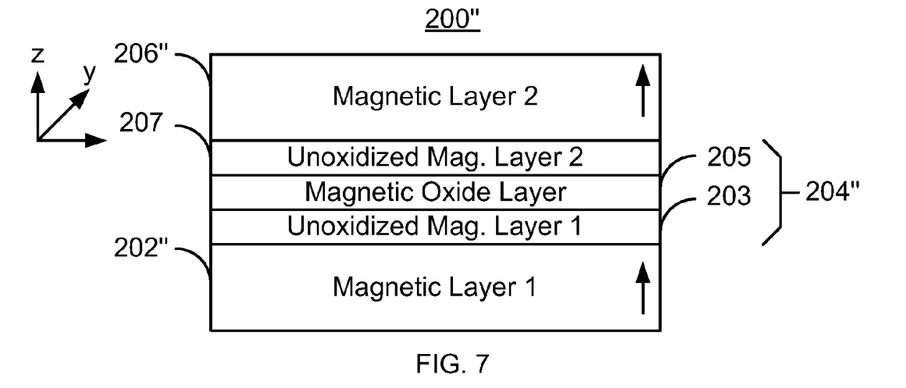
FIG. 7 depicts another exemplary embodiment of a free layer having an insertion layer induced perpendicular magnetic anisotropy and switchable using spin transfer.

FIG. 7 depicts an exemplary embodiment of a free layer 200" that has an engineered PMA, that is switchable using spin transfer, and that may be used in a magnetic junction such as the magnetic junction 100, 100', and/or 100'. For clarity, FIG. 7 is not to scale. The free layer 200" is analogous to the free layers 200 and 200'. Thus, analogous layers are labeled similarly. The free layer 200" includes two magnetic layers 202" and 206" separated by a magnetic insertion layer 204" that are analogous to the magnetic layers 202/202' and 206/206' and the magnetic oxide/insertion layer 204/204', respectively. In some embodiments, the free layer 200" consists of layers 202", 204", and 206". In other embodiments, the free layer 200" may be a multilayer including but not limited to a SAF. In such embodiments, the layers 202", 204" and/or 206" may be included in one or more of the ferromagnetic layers of the SAF.

The insulating magnetic insertion layer 204" includes an unoxidized magnetic layers 203 and 207 and magnetic oxide layer 205. The insulating magnetic insertion layer 204" may be formed by depositing a magnetic layer, oxidizing the layer and depositing another magnetic layer. Thus, the magnetic oxide layer 205 and unoxidized magnetic layer 203 may be formed from a single magnetic layer. In some embodiments, the layers 203 and 207 are Ni layers, while the magnetic oxide layer 205 is oxidized Ni. The magnetic oxide layer 205 is desired to be ferromagnetic (not antiferromagnetic). Thus, the layer 205 may be less than three monolayers thick. The magnetic layers 202" and 206" may be CoFeB layers having not more than twenty percent B and having a thickness of not more than twenty Angstroms. However, in other embodiments, other magnetic materials and other thicknesses might be used. The insulating magnetic insertion layer 204" may still enhance the PMA of the magnetic layers 202" and 206" as well as allowing for ferromagnetic coupling between the magnetic layers 202" and 206".

The free layer 200" shares the benefits of the free layers 200 and/or 200'. In particular, the free layer 200" has an engineered PMA that is tailored using the magnetic insertion layer 204". In some embodiments, the free layer 200" has an increased PMA. Further, because the magnetic layers 202" and 206" are ferromagnetically coupled, the free layer 200" is more thermally stable. As a result, performance of the free layer 200" and the performance of magnetic elements incorporating the free layer 200" may be improved.

Figure 8:
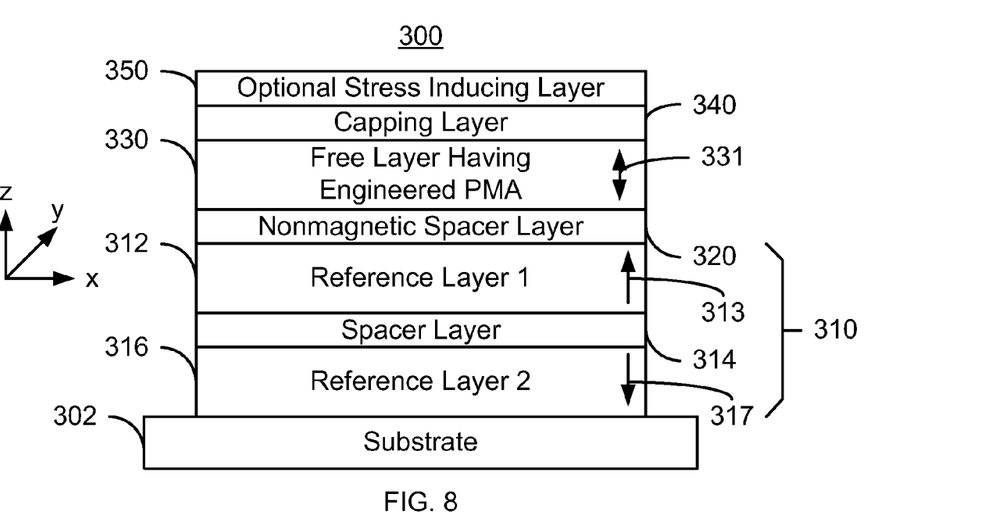
FIG. 8 depicts an exemplary embodiment of a free layer having a stress induced perpendicular magnetic anisotropy and switchable using spin transfer.

FIG. 8 depicts another embodiment of a magnetic junction 300 including a free layer 330 having an engineered PMA and that is switchable using spin transfer. For clarity, FIG. 8 is not to scale. The magnetic junction 300 is shown as residing on a substrate 302. The magnetic junction 300 is analogous to the magnetic junctions 100, 100' and/or 100". The magnetic junction 300 thus includes a reference layer 310, a nonmagnetic spacer layer 320, a free layer 330 having an engineered PMA, a capping layer 340 and an optional stress-inducing layer 350. The stress inducing layer 350 exerts a stress on the on the free layer 330 that may be used to engineer the PMA of the free layer. The reference layer 310, nonmagnetic spacer layer 320 and free layer 330 are analogous to the reference layer 110/110'/110", nonmagnetic spacer layer 120/120'/120" and free layer 130/130'/130", respectively. The capping layer 340 may also be analogous to the capping layer 140/140', respectively. Although layers 310, 320, 330 and 340 are shown with a particular orientation, this orientation may vary in other embodiments. In some embodiments, an optional seed layer (not shown), an optional pinning layer (not shown) and/or optional capping layer (not shown) may be included. The magnetic junction 300 is also configured to allow the magnetization of the free layer 330 to be switched between stable magnetic states when a write current is passed through the magnetic junction 300. Thus, the magnetic moment 331 of the free layer 330 is switchable utilizing spin transfer torque. In some embodiments, spin transfer torque may be used in addition to or in lieu of another switching mechanism. In addition, the free layer 330 has an engineered PMA analogous to that described above.

The nonmagnetic spacer layer 320 may be a tunneling barrier layer, conductor, or other structure for which magnetoresistance is exhibited between the reference layer 310 and the free layer 330. In some embodiments, the nonmagnetic spacer layer 320 is a crystalline MgO tunneling barrier layer. Such a nonmagnetic spacer layer may have a preferred crystallographic orientation, such as a (100) orientation. In such embodiments, the nonmagnetic spacer layer 320 may enhance the PMA as well as the magnetoresistance of the magnetic junction 300.

In the embodiment shown, the reference layer 310 is a SAF including ferromagnetic layers 312 and 316 separated by nonmagnetic spacer layer 314. The ferromagnetic layers 312 and 316 are antiferromagnetically coupled, for example via an RKKY coupling. In other embodiments, the reference layer 310 may include additional layers, be another multilayer, may be a simple layer and/or may have a different magnetic coupling. The free layer 330 is shown as being a simple layer. However, in other embodiments, the free layer 330 may be a multilayer including but not limited to a SAF, a multilayer 200, 200', and/or 200", or have another structure. The reference layer 310 and/or the free layer 330 each has a high PMA in the embodiment shown in FIG. 8. Thus, the ferromagnetic layers 312 and 316 (of the reference layer 310) and the free layer 330 each has its magnetic moment 313, 317 and 331, respectively, oriented perpendicular to plane at equilibrium as is shown in FIG. 8. However, in other embodiments, one or both of the reference layer 310 and the free layer 330 may have an in-plane magnetic moment. The magnetic moments 313 and 317 of the reference layer 310 may be fixed in a particular direction. In the embodiment shown, the magnetic moments 313 and 317 are in the positive and negative z-directions, respectively. In another embodiment, the orientations may be reversed. In other embodiments, the magnetic moments 313 and/or 317 of the reference layer 330 may be stable in another direction including but not limited to in-plane. Other orientations of the magnetic moments of the reference layer 310 and/or the free layer 330 are possible.

The free layer 330 has an engineered PMA. In particular, the PMA of the free layer 330 may be tailored using stress. It is known that the PMA of materials, such CoFeB and other Fe containing materials, may depend upon the stress on the material. The stress may increase or decrease the PMA depending upon the materials, the type of stress (tensile/compressive), the magnitude of the stress, and other factors. Thus, by tailoring the stress on the free layer 330, the PMA of the free layer 330 can be configured to be in a desired range. In addition, the free layer may incorporate the magnetic oxide/insertion layers 204, 204', 208 or 204".

The stress on the free layer 330 may be induced using the free layer 330 itself, using adjoining layers 320 and/or 340, and/or using optional stress inducing layer 350. For example, deposition conditions, selection of material(s), thickness(es) of, and tailoring other aspects of the layers 320, 330, 340 and/or 350 might be used. Further, one or more of these mechanisms may be combined.

In some embodiments, the free layer 330 is deposited on a heated substrate, which allows greater mobility and/or flexibility in lattice matching. The lattice constant of the underlying layer 320 may be expanded upon deposition, but contract as the magnetic junction 300 is cooled. As a result, the free layer 330 may be subject to a stress. A mismatch in the lattice constant between the free layer 330 and surrounding layers 320, 340, and/or 350 may similarly exert a stress on the free layer 330 that affects the PMA of the free layer. This lattice mismatch may be selected such that the free layer 330 has the desired PMA. In some embodiments, the lattice mismatch with an adjoining layer is desired to be greater than zero and not more than approximately ten percent. In some embodiments, the mismatch is desired to be at least three and not more than seven percent. The materials of the surrounding layers may also be selected to engineer the PMA of the free layer using this stress. The nonmagnetic spacer layer 320 and/or the capping layer 340 being crystalline MgO may also exert a stress on the free layer 330 that increases the PMA. This stress may be engineered by doping the MgO or otherwise changing the lattice constant of the crystalline MgO. In addition to the lattice mismatch with adjoining layers 320 and 340, other mechanisms for introducing stress into the free layer 330 that enhances PMA may be used.

In some embodiments, the stress may be configured to be constant in time or to vary with time. For example, the stress-induced PMA of the free layer 330 may be configured to decrease upon the application of a switching current through the magnetic junction 300. This may be achieved through a stress that is temperature dependent. As a current is driven through the magnetic junction, the magnetic junction 300 is heated. If, for example, there is a mismatch in the coefficient of thermal expansion between the free layer 330 and adjacent layers layer(s) 320, 340, and/or 350, the free layer 330 expands to a different extent than the adjoining layer(s). This mismatch in expansion due to the increase in temperature may induce a stress on the free layer 330. This stress may change the PMA. In some embodiments, the PMA is decreased with increasing temperature/current. The decrease in PMA may allow the magnetic moment 331 of the free layer 330 to cant from the perpendicular equilibrium state. As a result, spin transfer torque may more efficiently switch the magnetic moment. Stated differently, the magnetic moment of the free layer 110 may be switched at a lower current. Thus, the magnetic state of the free layer 330 may be more thermally stable at equilibrium, but may switch at a lower current because the PMA also decreases upon application of the current.

In some embodiments, the stress on the free layer 330 may also have a gradient across the free layer. This may occur, for example, if the free layer 330 is a multilayer. The lattice mismatch between the sublayers of the free layer 330 may induce a stress on the free layer. The free layer 330 may also be deposited on a heated substrate. The lattice constant of the underlying layer 320 may be expanded upon deposition, but contract as the magnetic junction 300 is cooled. As a result, the free layer 330 may be subject to a stress that may or may not have an appreciable gradient through the free layer 330. A gradient in the stress, and thus in the PMA, may allow for a reduced switching current for the same thermal stability constant.

The location of and material(s) for the stress inducing layer 350 may also be used to engineer the PMA of the free layer 330. Although depicted on the opposite side of the capping layer 340 from the free layer, in some embodiments, the stress inducing layer 350 may be on the same side of the capping layer 340 as the free layer 330. In some such embodiments, the stress inducing layer is desired to be thin. In some embodiments, the stress inducing layer is thinner than twenty Angstroms. In some such embodiments, the stress inducing layer 3450 has a thickness that is less than ten Angstroms. The stress inducing layer 350 may also be between the free layer 330 and the nonmagnetic spacer layer 320 if the stress inducing layer 350 does not substantially adversely affect switching or TMR. In some embodiments, the stress inducing layer 350 includes Ru. In such embodiments, the Ru layer 350 is desired to be above both the MgO capping layer 340 and the free layer 330 for an increased PMA. In contrast, a Ru stress inducing layer 350 that is below the free layer 350 results in a decreased PMA.

Using one or more of the stress inducing mechanisms described above for the layers 320, 330, 340 and 350, the PMA of the free layer 330 may be engineered. In some embodiments, the PMA of the free layer 330 may be increased, allowing the free layer magnetic moment 331 to be stable in a perpendicular configuration. In some such embodiments, the stress and thus the magnitude of the engineered PMA of the free layer 330 may be temperature dependent. As a result, the PMA may be reduced at higher temperatures, allowing for switching at lower write currents while maintaining thermal stability. Thus, performance of the magnetic junction 300 may be improved.

Figure 9:
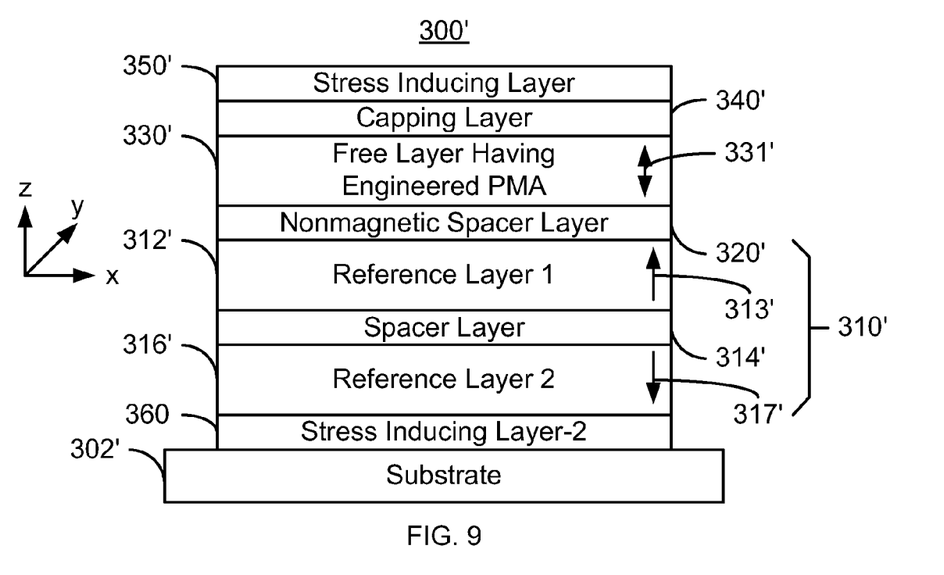
FIG. 9 depicts another exemplary embodiment of a free layer having a stress induced perpendicular magnetic anisotropy and switchable using spin transfer.

FIG. 9 depicts an exemplary embodiment of a magnetic junction 300' that has an engineered PMA and is switchable using spin transfer. The magnetic junction 300' is shown as residing on a substrate 302'. For clarity, FIG. 9 is not to scale. The magnetic junction 300' is analogous to the magnetic junctions 100, 100', 100" and/or 300. The magnetic junction 300' thus includes a reference layer 310', a nonmagnetic spacer layer 320', a free layer 330' having an engineered PMA, a capping layer 340', stress-inducing layer 350' and stress inducing layer 360. The stress inducing layer 360 exerts a stress on the free layer 330. The reference layer 310', nonmagnetic spacer layer 320', free layer 330' and optional stress inducing layer 350' are analogous to the reference layer 110/110'/110"/310, nonmagnetic spacer layer 120/120'/120"/320 and free layer 130/130'/130"/330 and 350, respectively. The capping layer 340' may also be analogous to the capping layer 140/140'/340. Although layers 310', 320', 330' and 340 are shown with a particular orientation, this orientation may vary in other embodiments. In some embodiments, an optional seed layer (not shown), an optional pinning layer (not shown) and/or optional capping layer (not shown) may be included. The magnetic junction 300' is also configured to allow the magnetization of the free layer 330' to be switched between stable magnetic states when a write current is passed through the magnetic junction 300'. Thus, the magnetic moment 331' of the free layer 330' is switchable utilizing spin transfer torque. In some embodiments, spin transfer torque may be used in addition to or in lieu of another switching mechanism. In addition, the free layer 330 has an engineered PMA analogous to that described above.

The engineered PMA of the free layer 330' may be configured at least in part using stress. This stress may be tailored in part using the stress inducing layer 350' (which may be Ru) and capping layer 340' that may be crystalline MgO. In addition, the stress inducing layer 360 may induce a stress on the free layer 330' through the reference layer 310'. In some embodiments, stress inducing layer 360 may be used instead of the stress inducing layer 350'. The stress inducing layer 360 may enhance the stress on the free layer 330'. When used in connection with the stress inducing layer 350', the stress on the free layer 330 may be further tailored. In some embodiments, the stress inducing layers 350' and 360 may act to further increase the PMA of the free layer. Other properties, such as the temperature dependence, of the PMA may be further configured. For example, the layers 350' and 360 may have a large mismatch in thermal expansion coefficients. The temperature of the magnetic junction 300' may be increased, for example due to joule heating as a write current is driven through the magnetic junction 300'. The expansion of the magnetic junction 300' may vary greatly between the layers 360 and 350'. Consequently, the free layer 330' may be subject to an increased stress. This increase in stress may reduce the PMA of the free layer 330'. As a result, the magnetic moment 331' of the free layer 330' may deviate from the z-direction (the stagnation point for spin transfer torque). Spin transfer may, therefore, operate more efficiently to switch the moment 331' of the free layer 330'. Consequently, the switching current of the magnetic junction 300' may be reduced.

The magnetic junction 300' may share the benefits of the magnetic junction 300. Use of the additional stress inducing layer 360 may provide further opportunities for tailoring the stress on the free layer 330'. Thus, performance of the magnetic junction 300 may be further improved.

Figure 10:
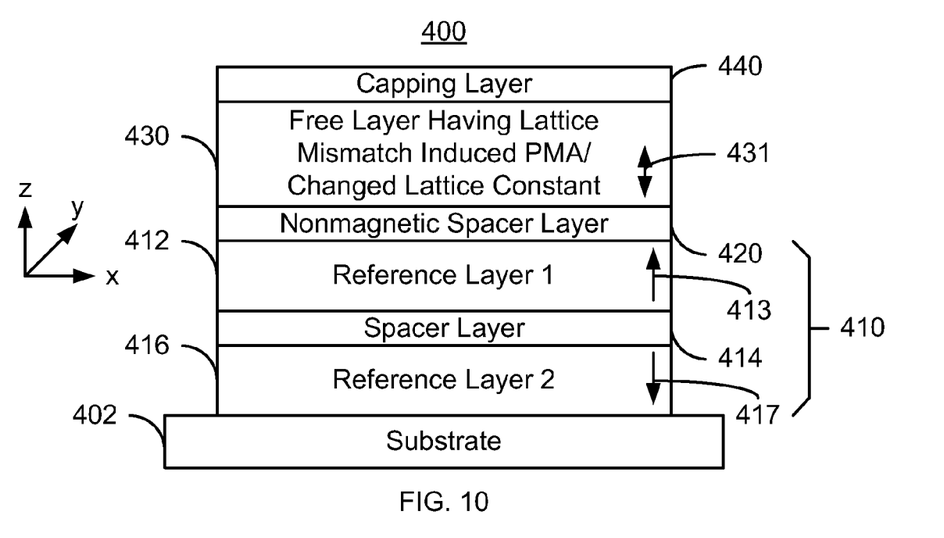
FIG. 10 depicts an exemplary embodiment of a free layer having a lattice parameter mismatch induced perpendicular magnetic anisotropy and switchable using spin transfer.

FIG. 10 depicts another embodiment of a magnetic junction 400 including a free layer 430 having an engineered PMA and that is switchable using spin transfer. For clarity, FIG. 10 is not to scale. The magnetic junction 400 is shown as residing on a substrate 402. The magnetic junction 400 is analogous to the magnetic junctions 100, 100', 100", 300 and/or 300'. The magnetic junction 400 thus includes a reference layer 410, a nonmagnetic spacer layer 420, a free layer 430 having a PMA engineered using at least a lattice constant change, and a capping layer 440 The reference layer 410, nonmagnetic spacer layer 420 and free layer 430 and capping layer 440 are analogous to the reference layer 110/110'/110"/310/310", nonmagnetic spacer layer 120/120'/120"/320/320', free layer 130/130'/130"/330/330', respectively. The capping layer 440 may also be analogous to the capping layer 140/140'/340/340'. Although layers 410, 420, 430 and 440 are shown with a particular orientation, this orientation may vary in other embodiments. In some embodiments, an optional seed layer (not shown), an optional pinning layer (not shown) and/or optional capping layer (not shown) may be included. The magnetic junction 400 is also configured to allow the magnetization of the free layer 430 to be switched between stable magnetic states when a write current is passed through the magnetic junction 400. Thus, the magnetic moment 431 of the free layer 430 is switchable utilizing spin transfer torque. In some embodiments, spin transfer torque may be used in addition to or in lieu of another switching mechanism.

The nonmagnetic spacer layer 420 may be a tunneling barrier layer, conductor, or other structure for which magnetoresistance is exhibited between the reference layer 410 and the free layer 430. In some embodiments, the nonmagnetic spacer layer 420 is a crystalline MgO tunneling barrier layer. In other embodiments, the nonmagnetic spacer layer 420 may include one or more of WO, MgO, TiO, VO, and MgO. Such a nonmagnetic spacer layer may have a preferred crystallographic orientation, such as a (100) orientation. In such embodiments, the nonmagnetic spacer layer 420 may enhance the PMA as well as the magnetoresistance of the magnetic junction 300.

In the embodiment shown, the reference layer 410 is a SAF including ferromagnetic layers 412 and 416 separated by nonmagnetic spacer layer 414. The ferromagnetic layers 412 and 416 are antiferromagnetically coupled, for example via an RKKY coupling. In other embodiments, the reference layer 410 may include additional layers, be another multilayer, may be a simple layer and/or may have a different magnetic coupling. The free layer 430 is shown as being a simple layer. However, in other embodiments, the free layer 430 may be a multilayer including but not limited to a SAF, a multilayer 200, 200', and/or 200", or have another structure. The reference layer 410 and/or the free layer 430 each has a high PMA in the embodiment shown in FIG. 10. Thus, the ferromagnetic layers 412 and 416 of the reference layer 410 and the free layer 430 each has its magnetic moment 413, 417 and 431, respectively, oriented perpendicular to plane at equilibrium as is shown in FIG. 10. However, in other embodiments, one or both of the reference layer 410 and the free layer 430 may have an in-plane magnetic moment. The magnetic moments 413 and 417 of the reference layer 410 may be fixed in a particular direction. In the embodiment shown, the magnetic moments 413 and 417 are in the positive z-direction. In another embodiment, the orientations may be reversed. In other embodiments, the magnetic moments 413 and/or 417 of the reference layer 430 may be stable in another direction including but not limited to in-plane. Other orientations of the magnetic moments of the reference layer 410 and/or the free layer 430 are possible.

The free layer 430 has an engineered PMA. In particular, the PMA of the free layer 430 may be tailored using a mismatch in lattice parameters. For example, in a conventional magnetic junction 10, the conventional free layer 20 is typically iron rich CoFe while the conventional barrier layer 18 is crystalline MgO. The layers 18 and 20 typically have a 5.3% lattice mismatch. In the embodiment shown in FIG. 10, the free layer 430 has a lattice constant that has been changed from that of the conventional free layer 20 to tailor the lattice mismatch. In some embodiments, the free layer 430 has been engineered to have an increased lattice constant to enhance the PMA. Thus, the lattice mismatch between the layers 420 and 430 is greater than 5.3%. In some embodiments, new binary or ternary alloys may be used. For example, the free layer may include $Fe_{1-x}M_x$, where M is Al, Ti, Zr, Hf, and/or Zn. Similarly, the free layer may include $Co_yFe_{1-x-y}M_x$, $Co_yFe_{1-x-y-z}B_zM_x$, where M is Al, Bi, Ta, Ti, Zr, Hf, Mo, W, Si, Ge, Sn and/or Zn. Typically M would be a few percent, for example, not more than 30%. In preferred embodiments it may include not more than 10%. In other embodiments, a modified Heusler alloy including $Co_2FeAl$, $Co_2FeSi$, and/or NiMnSb may be used to increase the lattice mismatch and, therefore, the PMA of the free layer 430.

The magnetic junction 400 may share the benefits of the magnetic junctions 100, 100', 100", 300 and/or 300'. Changing the lattice parameter of the free layer 430 may tailor the PMA of the free layer 430 as desired. Thus, performance of the magnetic junction 400 may be further improved.

Figure 11:
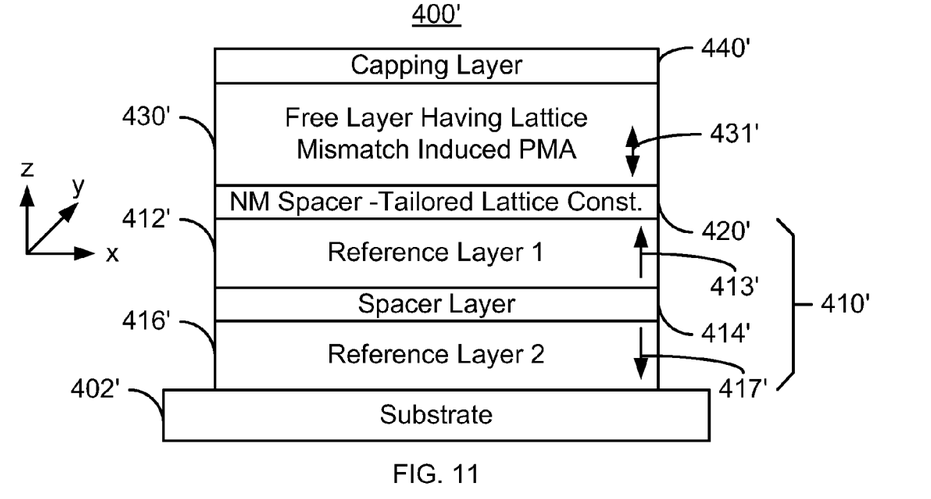
FIG. 11 depicts another exemplary embodiment of a free layer having a lattice parameter mismatch induced perpendicular magnetic anisotropy and switchable using spin transfer.

FIG. 11 depicts an exemplary embodiment of a magnetic junction 400' that has an engineered PMA and is switchable using spin transfer. The magnetic junction 400' is shown as residing on a substrate 402'. For clarity, FIG. 11 is not to scale. The magnetic junction 400' is analogous to the magnetic junctions 100, 100', 100", 300, 300' and/or 400. The magnetic junction 400' thus includes a reference layer 410', a nonmagnetic spacer layer 420', a free layer 430' having an engineered PMA, and a capping layer 440'. The reference layer 410', nonmagnetic spacer layer 420', free layer 430' and capping layer 440' are analogous to the reference layer 110/110'/110"/ 310/310'/410, nonmagnetic spacer layer 120/120'/120"/320/ 320'/420, free layer 130/130'/130"/330/330'/430 and capping layer 140/140'/340/340'440. Although layers 410', 420', 330' and 340 are shown with a particular orientation, this orientation may vary in other embodiments. In some embodiments, an optional seed layer (not shown), an optional pinning layer (not shown) and/or optional capping layer (not shown) may be included. The magnetic junction 400' is also configured to allow the magnetization of the free layer 430' to be switched between stable magnetic states when a write current is passed through the magnetic junction 400'. Thus, the magnetic moment 431' of the free layer 430' is switchable utilizing spin transfer torque. In some embodiments, spin transfer torque may be used in addition to or in lieu of another switching mechanism. In addition, the free layer 430' has an engineered PMA analogous to that described above. In some embodiments, the free layer 430' may have an increased lattice parameter as described with respect to FIG. 10.

Referring back to FIG. 11, the nonmagnetic spacer layer 420' may also have a tailored lattice parameter. In some embodiments, the lattice parameter of the nonmagnetic spacer layer 420' has been configured to increase the lattice mismatch with the free layer 430'. For example, the lattice parameter of the nonmagnetic spacer layer 420' may be reduced.

The magnetic junction 400' may share the benefits of the magnetic junctions 100, 100', 100", 300, 300' and/or 400. Changing the lattice parameter of the nonmagnetic spacer layer 420' may tailor the PMA of the free layer 430'. This effect may be enhanced if the lattice parameter of 430' is also changed. For example, the lattice parameter of the nonmagnetic spacer layer 420' may be reduced and the lattice parameter of the free layer 430' increased. Thus, performance of the magnetic junction 400' may be further improved.

Thus, one or more of the magnetic junctions 100, 100', 100", 300, 300', 400, 400' and/or free layers 200, 200' and/or 200" may be used. Because the PMA has been engineered, the performance of the magnetic junctions 100, 100', 100", 300, 300', 400, 400' and/or free layers 200, 200' and/or 200" may be improved.

Figure 12:
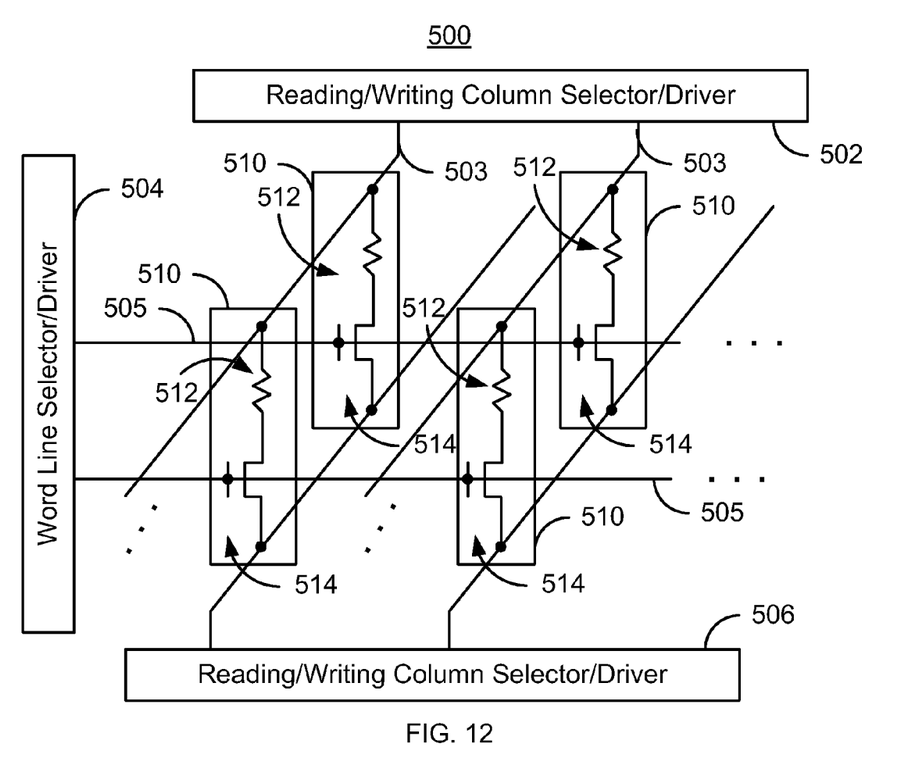
FIG. 12 depicts an exemplary embodiment of a memory utilizing magnetic junctions in the memory element(s) of the storage cell(s).

Further, the magnetic junctions 100, 100', 100", 300, 300', 400, 400' and/or free layers 200, 200' and/or 200" may be used in a magnetic memory. FIG. 12 depicts an exemplary embodiment of one such memory 500. The magnetic memory 500 includes reading/writing column select drivers 502 and 506 as well as word line select driver 504. Note that other and/or different components may be provided. The storage region of the memory 500 includes magnetic storage cells 510. Each magnetic storage cell includes at least one magnetic junction 512 and at least one selection device 514. In some embodiments, the selection device 514 is a transistor. The magnetic junctions 512 may include one or more of the magnetic junctions 100, 100', 100", 300, 300', 400, 400' and/or free layers 200, 200' and/or 200". Although one magnetic junction 512 is shown per cell 510, in other embodiments, another number of magnetic junctions 512 may be provided per cell.

Because the magnetic memory 500 utilizes the magnetic junctions 100, 100', 100", 300, 300', 400, 400' and/or free layers 200, 200' and/or 200", performance may be improved. For example, a lower switching current may be used while maintaining thermal stability of the memory 400.

Figure 13:
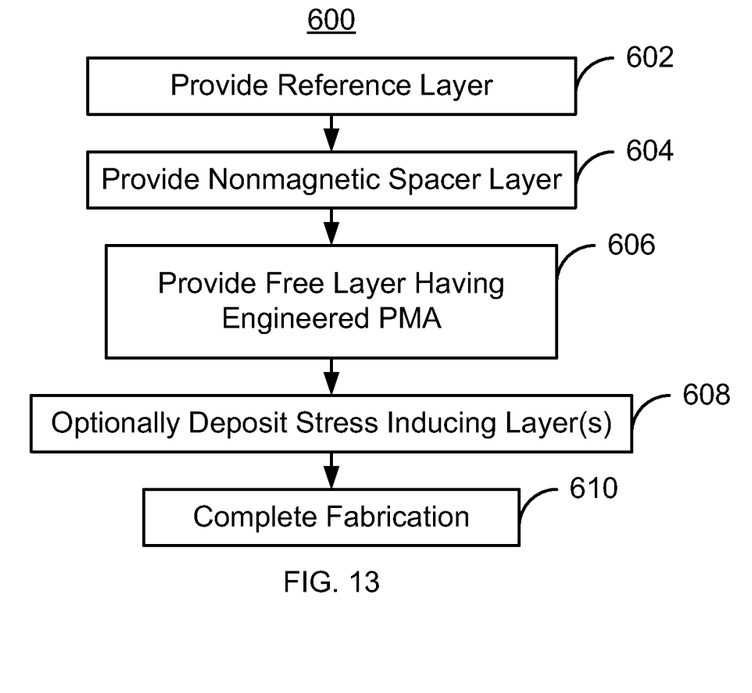
FIG. 13 depicts an exemplary embodiment of a method for fabricating a magnetic junction including a free layer having an engineered perpendicular magnetic anisotropy and switchable using spin transfer.

FIG. 13 depicts an exemplary embodiment of a method 600 for fabricating magnetic junction, such as the magnetic junctions 100, 100', 100", 300, 300', 400, and/or 400'. For simplicity, some steps may be omitted, combined, and/or interleaved. The method 600 is described in the context of the magnetic junction 100. However, the method 600 may be used on other magnetic junctions. Further, the method 600 may be incorporated into fabrication of magnetic memories. Thus the method 600 may be used in manufacturing a STT-MRAM 500 or other magnetic memory. The method 600 may also include providing optional seed layer(s), optional capping layer(s) and optional pinning layer (not shown).

The reference layer 110 is provided, via step 602. Step 602 may include depositing the desired materials at the desired thickness of the reference layer 110. Further, step 602 may include providing a SAF. The nonmagnetic layer 120 is provided, via step 604. Step 604 may include depositing the desired nonmagnetic materials, including but not limited to crystalline MgO. In addition, the desired thickness of material may be deposited in step 604. Further, for certain magnetic junctions, such as the magnetic junctions 400 and/or 400', the lattice parameter of the nonmagnetic layer 120 may be tailored.

The free layer 110 is provided, via step 606. Step 606 may include depositing the desired materials at the desired thickness of the free layer 130. More specifically, the free layer provided has the desired PMA. In step 606, the layers 130, 130', 130", 200, 200', 330, 330', 430 and/or 430' are fabricated. Step 606 may include providing a SAF. In some embodiments, step 606 includes heating the substrate during deposition, depositing multiple layers and/or oxidizing some portion of the layers.

The stress inducing layer(s) 350, 350' and/or 360 may optionally be provided, via step 608. Fabrication is completed, via step 610. In some embodiments, step 610 includes fabricating an additional spacer layer and an additional pinned layer. Optional capping and/or other layers may also be deposited in step 610. Thus, using the method 600, the benefits of the magnetic junctions 100, 100', 100", 300, 300', 400, 400' and free layers 200, 200' and/or 200" may be achieved.

Figure 14:
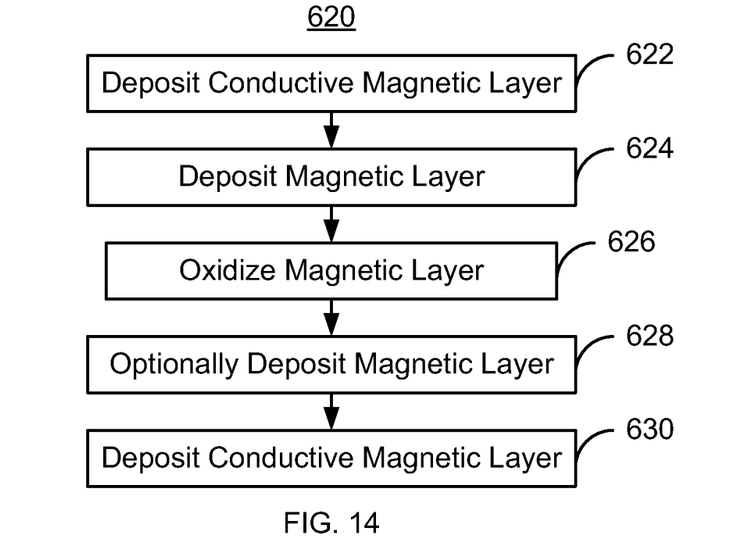
FIG. 14 depicts an exemplary embodiment of a method for fabricating a free layer having an insertion layer induced perpendicular magnetic anisotropy and switchable using spin transfer.

FIG. 14 depicts an exemplary embodiment of a method 620 for fabricating the free layer 200, 200' and/or 200". For simplicity, some steps may be omitted, combined, and/or interleaved. However, the method 620 may be used on other magnetic junctions. Further, the method 620 may be incorporated into fabrication of magnetic memories. Thus the method 620 may be used in manufacturing a STT-MRAM 500 or other magnetic memory.

A conductive magnetic layer 202/202'/202" is deposited, via step 622. A magnetic layer is deposited, via step 624. For the free layer 200/200', the magnetic layer deposited in step 624 is a magnetic oxide such as NiO. For the free layer 200", the magnetic layer deposited may be used to form a magnetic oxide. The magnetic layer deposited in step 624 is optically oxidized, via step 626. Thus, the layer 205 may be formed. Another magnetic layer 207 may then be deposited, via step 628. Thus, steps 624, 646 and 628 may be used to form magnetic insertion layer 204". Fabrication is completed, via step 630. Thus, using the method 620, the benefits of the free layers 200, 200' and/or 200" may be achieved.

A method and system for providing a free layer having an engineered PMA, a magnetic junction using such a free layer and a memory fabricated using the magnetic junction have been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction for use in a magnetic device comprising:
    a reference layer;
    a nonmagnetic spacer layer; and
    a free layer having an engineered perpendicular magnetic anisotropy (PMA), the free layer including a plurality of magnetic layers, the plurality of magnetic layers including at least one oxide layer and a plurality of conductive layers, the at least one oxide layer being ferromagnetic, interleaved with the plurality of conductive layers and sandwiched between the plurality of conductive layers, the nonmagnetic spacer layer being between the reference layer and the free layer, the engineered PMA including at least one of an insulating insertion layer induced PMA, a stress induced PMA, PMA due to interface symmetry breaking, and a lattice mismatch induced PMA;
    wherein the magnetic junction is configured such that the free layer is switchable between a plurality of stable magnetic states when a write current is passed through the magnetic junction.

2. The magnetic junction of claim 1 wherein the engineered PMA includes the insulating insertion layer PMA.

3. The magnetic junction of claim 2 wherein the at least one oxide layer includes at least one nickel oxide layer.

4. The magnetic junction of claim 3 wherein the free layer further includes at least one Ni layer adjoining the nickel oxide layer.

5. The magnetic junction of claim 1 wherein the engineered PMA includes the stress induced PMA and wherein the magnetic junction further includes:
    a stress inducing layer, and
    a capping layer adjoining the free layer and residing between the free layer and the at least one stress inducing layer.

6. The magnetic junction of claim 5 wherein the capping layer includes MgO and the stress inducing layer includes Ru.

7. The magnetic junction of claim 5 wherein the free layer further includes:
    a plurality of magnetic layers, the plurality of magnetic layers including at least one oxide layer and a plurality of conductive layers, the at least one oxide layer sandwiched between the plurality of conductive layers.

8. The magnetic junction of claim 5 further comprising:
    an additional stress inducing layer, the reference layer, the free layer and the nonmagnetic spacer layer being between the additional stress inducing layer and the stress inducing layer.

9. The magnetic junction of claim 8 wherein the stress inducing layer has a first coefficient of thermal expansion and the additional stress inducing layer has a second coefficient of thermal expansion different from the first coefficient of thermal expansion.

10. The magnetic junction of claim 8 wherein the stress inducing layer and the additional stress inducing layer provide a gradient in a stress of the free layer.

11. The magnetic junction of claim 5 wherein the stress inducing layer provides a compressive stress on the free layer.

12. The magnetic junction of claim 5 wherein the stress inducing layer provides a tensile stress on the free layer.

13. The magnetic junction of claim 1 wherein the engineered PMA includes the lattice mismatch induced PMA, the free layer and the nonmagnetic spacer layer having a lattice mismatch of greater than 5.3%.

14. The magnetic junction of claim 13 wherein the free layer further includes at least one of $Fe_{1-s}R_s$, $Co_tFe_{1-t-u}M_u$, $Co_yFe_{1-x-y-z}B_zM_x$ and a modified Heusler alloy, where R is at least one of Al, Ti, Zr, Hf, and Zn and where M is at least one of Al, Bi, Ta, Ti, Zr, Hf, Mo, W, Si, Ge, Sn and Zn.

15. The magnetic junction of claim 13 wherein the nonmagnetic spacer layer further includes at least one of WO, MgO, TiO, VO, and MgO.

16. A magnetic memory comprising:
a plurality of magnetic storage cells, each of the plurality of magnetic storage cells including at least one magnetic junction, the at least one magnetic junction including a pinned layer, a nonmagnetic spacer layer, and a free layer, the free layer having an engineered perpendicular magnetic anisotropy (PMA), the nonmagnetic spacer layer being between the pinned layer and the free layer, the engineered PMA including at least one of an insulating insertion layer induced PMA, a stress induced PMA, PMA due to interface symmetry breaking, and a lattice mismatch induced PMA, the free layer including a plurality of magnetic layers, the plurality of magnetic layers including at least one oxide layer and a plurality of conductive layers, the at least one oxide layer being ferromagnetic, interleaved with the plurality of conductive layers and sandwiched between the plurality of conductive layers, the magnetic junction being configured such that the free layer is switchable between a plurality of stable magnetic states when a write current is passed through the magnetic junction; and
a plurality of bit lines.

17. The magnetic memory of claim 16 wherein the engineered PMA includes the insulating insertion layer PMA.

18. The magnetic memory of claim 17 wherein the at least one oxide layer includes at least one nickel oxide layer.

19. The magnetic memory of claim 18 wherein the free layer further includes at least one Ni layer adjoining the nickel oxide layer.

20. The magnetic memory of claim 16 wherein the engineered PMA includes the stress induced PMA and wherein the magnetic junction further includes:
a stress inducing layer, and
a capping layer adjoining the free layer and residing between the free layer and the at least one stress inducing layer.

21. The magnetic memory of claim 20 wherein the capping layer includes MgO and the stress inducing layer includes Ru.

22. The magnetic memory of claim 20 wherein the free layer further includes:
a plurality of magnetic layers, the plurality of magnetic layers including at least one oxide layer and a plurality of conductive layers, the at least one oxide layer sandwiched between the plurality of conductive layers.

23. The magnetic memory of claim 20 further comprising:
an additional stress inducing layer, the reference layer, the free layer and the nonmagnetic spacer layer being between the additional stress inducing layer and the stress inducing layer.

24. The magnetic memory of claim 23 wherein the stress inducing layer has a first coefficient of thermal expansion and the additional stress inducing layer has a second coefficient of thermal expansion different from the first coefficient of thermal expansion.

25. The magnetic memory of claim 23 wherein the stress inducing layer and the additional stress inducing layer provide a gradient in a stress the free layer.

26. The magnetic memory of claim 20 wherein the stress inducing layer provides a compressive stress on the free layer.

27. The magnetic memory of claim 20 wherein the stress inducing layer provides a tensile stress on the free layer.

28. The magnetic memory of claim 16 wherein the engineered PMA includes the lattice mismatch induced PMA, the free layer and the nonmagnetic spacer layer having a lattice mismatch of greater than 5.3%.

29. The magnetic memory of claim 28 wherein the free layer further includes at least one of $Fe_{1-s}R_s$, $Co_tFe_{1-t-u}M_u$, $Co_yFe_{1-x-y-z}B_zM_x$ and a modified Heusler alloy, where R is at least one of Al, Ti, Zr, Hf, and Zn and where M is at least one of Al, Bi, Ta, Ti, Zr, Hf, Mo, W, Si, Ge, Sn and Zn.

30. The magnetic memory of claim 28 wherein the nonmagnetic spacer layer further includes at least one of WO, MgO, TiO, VO, and MgO.

31. A method for providing a magnetic junction for use in a magnetic device comprising:
providing a pinned layer;
providing a nonmagnetic spacer layer; and
providing a free layer having an engineered perpendicular magnetic anisotropy (PMA), the nonmagnetic spacer layer being between the pinned layer and the free layer, the engineered PMA including at least one of an insulating insertion layer induced PMA, a stress induced PMA, PMA due to interface symmetry breaking, and a lattice mismatch induced PMA, the step or providing the free layer including providing a plurality of magnetic layers, the plurality of magnetic layers including at least one oxide layer and a plurality of conductive layers, the at least one oxide layer being ferromagnetic, interleaved with the plurality of conductive layers and sandwiched between the plurality of conductive layers;
wherein the magnetic junction is configured such that the free layer is switchable between a plurality of stable magnetic states when a write current is passed through the magnetic junction.

32. The method of claim 31 wherein the engineered PMA includes the insulating insertion layer PMA.

33. The method of claim 32 wherein the at least one oxide layer includes at least one nickel oxide layer.

34. The method of claim 33 wherein the step of providing the plurality of magnetic layers further includes:
depositing a nickel layer;
oxidizing the nickel layer.

35. The method of claim 31 wherein the engineered PMA includes the stress induced PMA and wherein the method further includes:
providing a stress inducing layer, and
providing a capping layer adjoining the free layer and residing between the free layer and the at least one stress inducing layer.

36. The method of claim 35 wherein the capping layer includes MgO and the stress inducing layer includes Ru.

37. The method of claim 35 wherein the magnetic junction is fabricated on a substrate and wherein the step of providing the free layer further includes:
heating the substrate to a temperature above room temperature; and
depositing the free layer on the substrate while the substrate is at the temperature.

38. The method of claim 35 further comprising:
an additional stress inducing layer, the reference layer, the free layer and the nonmagnetic spacer layer being between the additional stress inducing layer and the stress inducing layer.

39. The method of claim 31 wherein the engineered PMA includes the lattice mismatch induced PMA, the free layer and the nonmagnetic spacer layer having a lattice mismatch of greater than 5.3%.

40. The method of claim 39 wherein the free layer further includes at least one of $Fe_{1-s}R_s$, $Co_tFe_{1-t-u}M_u$, $Co_yFe_{1-x-y-z}B_zM_x$ and a modified Heusler alloy, where R is at least one of Al, Ti, Zr, Hf, and Zn and where M is at least one of Al, Bi, Ta, Ti, Zr, Hf, Mo, W, Si, Ge, Sn and Zn.

* * * * *